United States Patent
Meier et al.

(10) Patent No.: US 7,493,355 B2
(45) Date of Patent: Feb. 17, 2009

(54) CIRCUIT CONFIGURATION FOR AVERAGING

(75) Inventors: Bernd Meier, Postbauer-Heng (DE); Peter Völkl, Wenzenbach (DE)

(73) Assignee: Siemens Aktiengesellschaft, Munich (DE)

( * ) Notice: Subject to any disclaimer, the term of this patent is extended or adjusted under 35 U.S.C. 154(b) by 698 days.

(21) Appl. No.: 10/528,588

(22) PCT Filed: Jul. 31, 2003

(86) PCT No.: PCT/DE03/02580

§ 371 (c)(1),
(2), (4) Date: Mar. 21, 2005

(87) PCT Pub. No.: WO2004/030211

PCT Pub. Date: Apr. 8, 2004

(65) Prior Publication Data

US 2006/0004898 A1 Jan. 5, 2006

(30) Foreign Application Priority Data

Sep. 19, 2002 (DE) ................. 102 43 564

(51) Int. Cl.
G06F 7/38 (2006.01)
(52) U.S. Cl. ..................... 708/445
(58) Field of Classification Search .......... 708/445
See application file for complete search history.

(56) References Cited

U.S. PATENT DOCUMENTS

| | | | |
|---|---|---|---|
| 4,352,094 A * | 9/1982 | Reneric | 341/118 |
| 5,142,286 A | 8/1992 | Ribner et al. | |
| 5,329,281 A | 7/1994 | Baumgartner et al. | |
| 5,659,316 A | 8/1997 | Stierli | |
| 6,593,870 B2 * | 7/2003 | Dummermuth et al. | 341/155 |
| 2003/0076249 A1 * | 4/2003 | Dummermuth et al. | 341/110 |

FOREIGN PATENT DOCUMENTS

| | | |
|---|---|---|
| DE | 30 01 499 C2 | 8/1980 |
| DE | 100 52 152 C1 | 9/2001 |
| EP | 0 367 522 A2 | 5/1990 |
| EP | 0 577 902 B1 | 1/1994 |
| EP | 0 804 038 A2 | 10/1997 |
| JP | 4-144423 | 5/1992 |
| JP | 8-511349 | 11/1996 |
| WO | 95/26017 | 9/1995 |

OTHER PUBLICATIONS

McCarthy, E. P. "A True Averaging Circuit for Instrumentation", Electronic Engineering, May 1984, pp. 35 and 36.
James C. Candy et al.: "Oversampling Delta-Sigma Data Converters", Theory, Design and Simulation. The Institute of Electrical and Electronics Engineers, Inc., New York, Dec. 1988, pp. 293-303.
Steven R. Norsworthy, et al.: "Delta-Sigma Data Converters", Theory, Design and Simulation. The Institute of Electrical and Electronics Engineers, Inc., New York, 1997, pp. 1-43.
Jürgen van Engelen, et al.: "Bandpass Sigma Delta Modulators", Stability Analysis, Performance and Design Aspects. 2000 ISBN: 0-7923-8698-1, pp. 1.

* cited by examiner

*Primary Examiner*—David H Malzahn
(74) *Attorney, Agent, or Firm*—Laurence A. Greenberg; Werner H. Stemer; Ralph E. Locher

(57) ABSTRACT

The invention relates to a circuit configuration for determining the average value of an input signal (s), comprising a signal input (1) for receiving the input signal (s) and comprising a signal output (13) for outputting an output signal (g) that depicts the average value of the input signal (s). According to the invention, a counter (10) is placed between the signal input (1) and the signal output (13) in order to conduct an averaging. Said counter is preferably controlled by a sigma-delta modulator (2).

8 Claims, 2 Drawing Sheets

CIRCUIT CONFIGURATION FOR AVERAGING

BACKGROUND OF THE INVENTION

FIELD OF THE INVENTION

The invention relates to a circuit arrangement for averaging or a circuit for determining the average value of an input signal (s) having;

a signal input for receiving the input signal (s) and a signal output for outputting an output signal indicating the average value of the input signal;

a counter or a summing unit being arranged between the signal input and the signal output for averaging the counter being connected on the input side to a comparator.

In automotive engineering solenoid valves are known to be used to control automatic transmission systems, being activated with a pulse width modulated current signal. The average value over time of the current is thereby determined, in order to be able to optimize the control response of the solenoid valve within a controlled system.

Conventional analog low-pass filters have hitherto been used for this, which filter alternating current components out of the current signal to a large extent and output the direct current component as an average value.

Disadvantages of known averaging by means of analog filters include the settling time of such filters, which means that the average value is generally not available until after several periods of pulse width modulation.

Averaging by means of analog filters is also relatively inaccurate, which is equally undesirable.

SUMMARY OF THE INVENTION

The object of the invention is therefore to create a circuit arrangement, which allows the fastest and most accurate averaging possible.

The invention includes the general technical doctrine that a summing unit or counter should be provided for averaging between the signal input and the signal output of the circuit arrangement.

Before the actual averaging process, the input signal to be evaluated is thus preferably first digitized, so that averaging can take place without the dynamic problems of analog filters in the digital domain.

In a preferred embodiment of the invention the summing unit or counter is connected on the input side to a sigma-delta modulator, which subjects the input signal to be evaluated to sigma-delta modulation and feeds the signal thus modulated to the summing unit or counter. Such sigma-delta modulators are for example known from NORSWORTHY/SCHREIER/TEMES: "Delta-Sigma Data Converters" (IEEE Press), CANDY/TEMES: "Oversampling Delta-Sigma Data Converters: Theory, Design and Simulation" (IEEE Press) and ENGELEN/PLASSCHE: "Bandpass Sigma Delta Modulators" (Kluwer Academic Publishers), the entire content of which is to be considered part of the present description in respect of the design of the sigma-delta modulator.

The sigma-delta modulator should thereby operate with a clock frequency or sampling rate, which is greater than the Nyquist rate of the input signal, so that oversampling takes place and no signal information is lost from the input signal.

In the case of a periodic input signal, it is also advantageous if the same time window of the input signal is always evaluated. This is expediently the simple or multiple period of the input signal. The counter therefore preferably has a reset input, to which a control signal is fed, which is generated for example by a micro-controller. The control signal and the input signal to be evaluated preferably have a temporally constant phase relationship to each other, so that the same time window of the input signal is always evaluated.

In the case of a periodic input signal, it is also advantageous, if the input signal and the clock signal of the sigma-delta modulator have a temporally constant phase relationship to each other, so that the same time window of the input signal is always evaluated. The input signal for the sigma-delta modulator is therefore preferably derived from the clock signal to be evaluated, for which a conventional micro-controller can be used for example.

It should also be pointed out that the sigma-delta modulator can either be configured as analog or digital.

On the input side the sigma-delta modulator preferably has an adding or subtracting unit and an integrator and on the output side a comparator, the output of the comparator being fed back in a feedback loop to an input of the adding or subtracting unit.

The integrator of the sigma-delta modulator can for example be configured as a first order integrator but higher order integrators can also be used in the sigma-delta modulator, resulting advantageously in a higher resolution.

The comparator arranged on the output side in the sigma-delta modulator has a predefined decision threshold, which preferably corresponds to a zero level of the input signal. If the value is above the decision threshold, the comparator preferably outputs a positive level, while if the value drops below the decision threshold, the comparator preferably outputs a negative level.

In a preferred embodiment of the invention the output of the comparator is not fed back directly to the input of the adding or subtracting unit in the feedback loop but to the controller of a switching element, which switches either a first reference signal or a second reference signal to the input of the adding or subtracting unit. This is advantageous as the output signal of the comparator can contain inaccuracies, which are thus not fed back and therefore suppressed. The reference signals can on the other hand be generated by reference signal sources with greater accuracy and consistency, so that the accuracy of the averaging process is enhanced by this indirect feedback.

In another variant of the invention however no sigma-delta modulator is required, an analog/digital converter being provided on the input side, which samples the analog input signal to be evaluated, converts it to a digital signal and then feeds it directly or indirectly to the summing unit or counter. The average value over time of the input signal can then be determined easily from the number of previous samplings and the output signal of the summing unit or counter, by dividing the output signal of the summing unit by the number of accumulated sampling values.

The analog/digital converter should thereby also operate at a sampling rate, which is greater than the Nyquist rate of the input signal, so that oversampling takes place and no signaling information is lost from the input signal.

In the case of a band-limited input signal with a predefined upper limit frequency, the clock frequency of the analog/digital converter is therefore preferably a whole number multiple of the limit frequency of the input signal to be evaluated, oversampling by a factor of 16, 32 or 64 being advantageous, to achieve an adequate signal to noise ratio.

In the case of a periodic input signal, it is also advantageous if the same time window of the input signal is always sampled. The summing unit thereby preferably has a reset input, to which a control signal is fed, which is generated for example by a micro-processor. The control signal and the input signal to be evaluated thereby have a temporally constant phase relationship to each other, so that the same time window of the input signal is always evaluated.

In the two variants described above with a sigma-delta modulator in one case and a high-speed analog/digital converter in the other, an output register is preferably provided on the output side to buffer the average value, until the next average value has been calculated.

The circuit arrangement according to the invention is preferably suitable for averaging in the case of current and voltage signals in automotive engineering. For example—as already indicated—the input signal to be evaluated can be a current signal, which is used to activate a solenoid valve.

It should also be pointed out that the circuit arrangement according to the invention does not necessarily have to be configured as a separate circuit. It is also possible for the circuit arrangement according to the invention to be part of a complex electronic circuit, which fulfils other functions in addition to averaging.

BRIEF DESCRIPTION OF THE DRAWING

Other advantageous developments of the invention are contained in the subclaims or are described below in conjunction with the description of the preferred exemplary embodiments of the invention, with reference to the drawings, in which:

DESCRIPTION OF THE PREFERRED EMBODIMENTS

Figure 1:
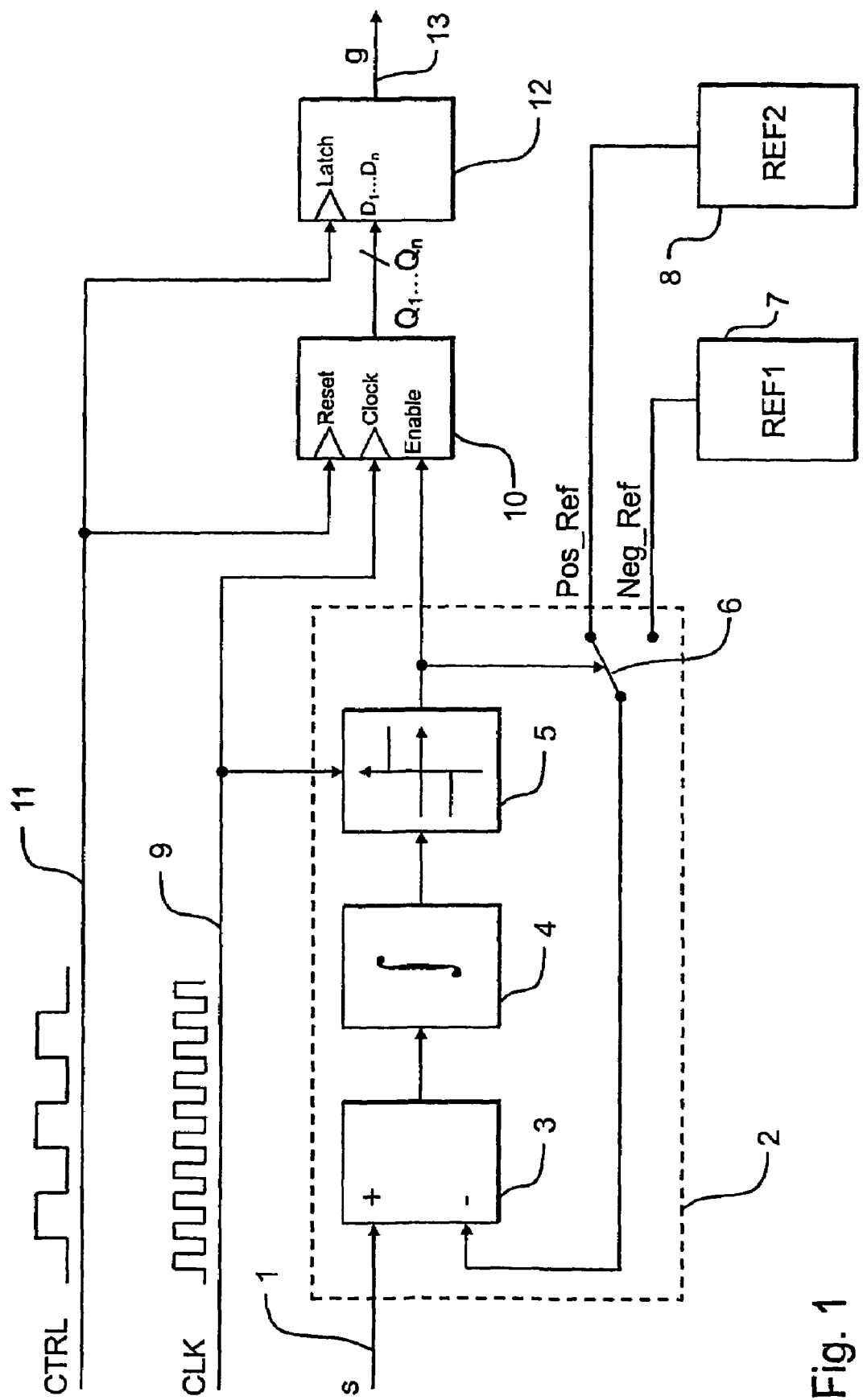
FIG. 1 shows a circuit diagram of a circuit arrangement according to the invention with a sigma-delta modulator for averaging and FIG. 2 shows a circuit diagram of an alternative circuit arrangement with a high-speed analog/digital converter instead of a sigma-delta modulator.

The circuit arrangement shown in FIG. 1 can for example be used in an electronic transmission control system of a motor vehicle, to determine the average value over time of a current signal s.

To this end the circuit arrangement according to the invention has a signal input 1, at which the current signal s to be evaluated is present.

Connected downstream from the signal input 1 is a sigma-delta modulator 2, which is analog in structure and comprises an adding unit 3, an integrator 4 and a comparator 5.

The adding unit 3 has a non-inverting input, which is connected to the signal input 1 of the circuit arrangement according to the invention and receives the input signal s.

The adding unit 3 also has an inverting input, which can optionally be connected via a switching element 6 to one of two reference signal sources 7, 8. The reference signal source 7 hereby generates a reference signal Neg_Ref with a negative polarity, while the reference signal source 8 generates a reference signal Pos_Ref with a positive polarity.

Activation of the switching element 6 takes place as a function of the signal that appears at the output of the comparator 5. To this end the switching element 6 has a control input, which is connected to the output of the comparator 5.

If the output signal of the comparator 5 has a positive polarity, the switching element 6 connects the inverting input of the adding unit 3 to the reference signal source 8.

If the output signal of the comparator 5 has a negative polarity however, the switching element 6 connects the inverting input of the adding unit 3 to the reference signal source 7.

This indirect feeding back of the comparator output to the inverting input of the adding unit has the advantage compared with direct feeding back that the reference signal sources 7, 8 can generate a significantly more accurate and temporally constant signal, while the output signal of the comparator 5 contains inaccuracies 5.

On the output side the adding unit 3 is connected to the input of the integrator 4, the integrator 4 being a first order integrator, to allow simple configuration with regard to circuit engineering.

The integrator 4 is in turn connected on the output side to the comparator 5, which compares the output signal of the integrator 4 with a decision threshold, which corresponds to a zero level of the input signal s.

If the value is above the decision threshold, the comparator 5 outputs an output signal with a positive polarity, so that the switch 6 connects the inverting input of the adding unit 3 to the reference signal source 8.

If the value is below the decision threshold however, the comparator 5 outputs an output signal with a negative polarity, so that the switch 6 connects the inverting input of the adding unit 3 to the reference signal source 7.

Activation of the switch 6 and a counter 10 by the comparator hereby takes place in a clock-controlled manner by means of a clock signal CLK, which is generated by a micro-controller and is present at a clock input 9. The clock frequency $f_{CLK}$ of the clock signal CLK is hereby twice the limit frequency $f_s$ of the band-limited input signal s, n being a whole number greater than or equal to 1. This is expedient so that oversampling takes place and no signal information is lost.

On the output side the sigma-delta modulator 2 is connected to an enabling input ENABLE of the counter 10. A high level at the enabling input ENABLE thus allows a counting process, in which the counter reading is incremented in the counter 10.

The counter 10 also has a clock input CLOCK, which is connected to the clock input 9 and thus is also activated by the clock signal CLK.

The counter also has a reset input RESET, which is supplied with a control signal CTRL, the control signal CTRL being present at a control input 11 and being generated by a micro-controller. It should be pointed out here that the control signal CTRL is generated by the micro-controller such that there is always a constant phase relationship between the input signal s and the control signal CTRL. This means that the same time window of the periodic input signal s is evaluated in each instance, as the counter 10 is reset by the control signal CTRL.

The counter reading of the counter 10 thus indicates the average value over time of the input signal s during the current period of pulse width modulation.

On the output side the counter 10 is connected to an output register 12, which buffers the counter reading during the next period. At the end of the next period the new counter reading is transferred to the output register. The transfer of the counter reading to the output register 12 is hereby controlled by a control input LATCH, at which the control signal CTRL is present.

The circuit arrangement according to the invention finally outputs an output signal g at a signal output 13, indicating the average value over time of the input signal s during the last period.

Figure 2:
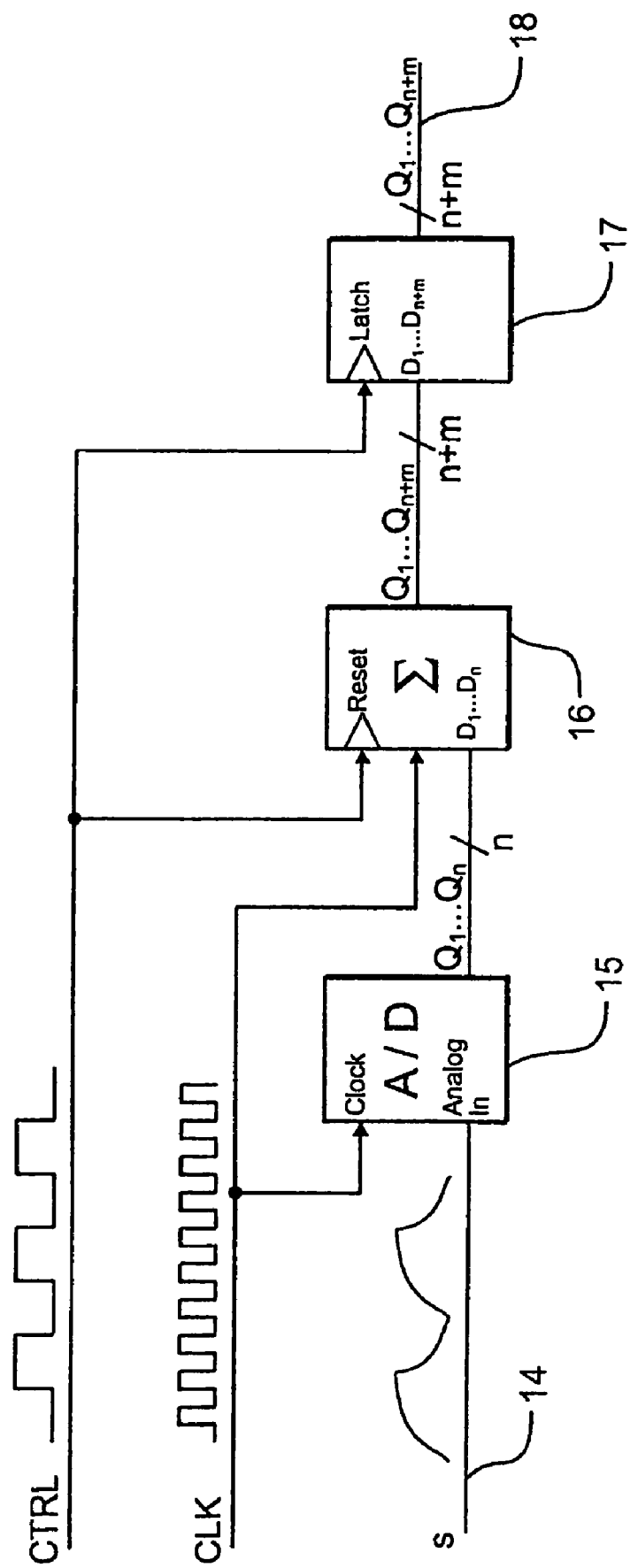

The circuit diagram shown in FIG. 2 showed a further exemplary embodiment of a circuit arrangement according to the invention for averaging, in which there is no need for a sigma-delta modulator.

To receive an input signal s to be evaluated, this circuit arrangement has a signal input 14, the input signal s possibly being a current signal of an electronic transmission control system in an automobile for example.

The input signal s is fed to a sampling input ANALOG IN of an analog/digital converter 15, which generates a digital signal $Q_1 \ldots Q_n$ with a width of n bits from the input signal s.

The analog/digital converter 15 is hereby clocked by a clock signal CLK, which is present at a clock input CLOCK of the analog/digital converter 15 and determines the sampling rate.

The clock signal CLK is generated by a micro-controller, which is not shown for the purposes of simplification, the clock frequency of the clock signal CLK being essentially greater than the limit frequency of the band-limited input signal s, so that oversampling takes place and no signal information is lost. In this exemplary embodiment the clock frequency of the clock signal is 32 times the limit frequency of the input signal s, giving a good signal to noise ratio.

On the output side the analog/digital converter 15 is connected to a summing unit 16, which sums the digital signals $Q_1 \ldots Q_n$ received on the input side and outputs a corresponding digital signal $Q_1 \ldots Q_{n+m}$ with a word length of n+m bits on the output side.

The summing unit 16 is hereby also clocked by the clock signal CLK, so that all the digital signals $Q_1 \ldots Q_n$ sampled by the analog/digital converter 15 are summed.

The summing unit 16 also has a reset input RESET, to which a control signal CTRL is fed, which is generated by the micro-controller (not shown). It should again be pointed out here that the control signal CTRL is generated by the micro-controller such that there is always a constant phase relationship between the input signal s and the control signal CTRL. This means that the same time window of the periodic input signal s is evaluated in each instance, as the summing unit 16 is reset by the control signal CTRL. Thus the sum $Q_1 \ldots Q_{n+m}$ of all the digital signals $Q_1 \ldots Q_n$ appears at the output of the summing unit 16 during the current period in each instance.

On the output side the summing unit 16 is connected to an output register 17, which buffers the sum determined during the next period. At the end of the next period the new summed value is then transferred to the output register 17. The transfer of the new summed value from the summing unit 16 to the output register 17 is hereby controlled by a control input LATCH, at which the control signal CTRL is present.

On the output side the output register 17 then outputs an output signal $Q_1 \ldots Q_{n+m}$ at a signal output 18, said output signal indicating the sum of the sampling values during the last period. The average value over time during the last period can then be calculated from this in conjunction with the number of samplings or the sampling rate.

The invention is not restricted to the preferred exemplary embodiments described above. Rather a plurality of variants and modifications are possible, which also utilize the inventive idea and therefore come into the scope of the patent.

We claim:

1. A circuit configuration for determining an average value of an input signal, comprising:
   a signal input terminal for receiving the input signal and
   a signal output terminal for outputting an output signal (g, $Q_1 \ldots Q_{n+m}$) indicating the average value of the input signal;
   a comparator connected between said signal input terminal and said signal output terminal, said comparator having an output;
   a counter or summing unit connected between said signal input and said signal output for averaging, said counter having an input connected to said output of said comparator;
   a switching element connected in a feedback loop for selectively connecting a first reference signal or a second reference signal to an input of said comparator and activated by said output of said comparator for switching to the first reference signal or the second reference signal in dependence on an output signal at said output of said comparator;
   said counter or summing unit having a reset input connected to receive a control signal, wherein the control signal and the input signal have at least one of a common fundamental frequency, a common phase angle, and a constant phase relationship to one another.

2. The circuit configuration according to claim 1, wherein said comparator forms a functional unit of a sigma-delta modulator and said input of said counter or summing unit is connected to said sigma-delta modulator.

3. The circuit configuration according to claim 2, wherein said sigma-delta modulator has an adding unit or a subtracting unit, an integrator and said comparator, and said feedback loop from said output of said comparator to an input of said adding unit or subtracting unit.

4. The circuit configuration according to claim 1, wherein said counter or summing unit has a clock input connected to receive a clock signal with a predefined clock frequency.

5. The circuit configuration according to claim 4, wherein the input signal is band-limited and has a predefined limit frequency, and the clock frequency is a whole-number multiple of the limit frequency.

6. The circuit configuration according to claim 4, wherein the clock signal and the control signal have a temporally constant phase relationship to one another.

7. The circuit configuration according to claim 1, which comprises an output register, and wherein said counter or summing unit has an output connected to said output register.

8. The circuit configuration according to claim 7, wherein said output register has a control input for controlling a receipt of data, said control input receiving the control signal.

* * * * *